United States Patent [19]

Flogaus

[11] Patent Number: 4,750,569
[45] Date of Patent: Jun. 14, 1988

[54] CABINET LATCH & ELECTROMAGNETIC SHIELDING ENCLOSURE INCLUDING SAME

[75] Inventor: William S. Flogaus, Alexandria, Va.

[73] Assignee: Systematics General Corporation, Sterling, Va.

[21] Appl. No.: 10,535

[22] Filed: Feb. 3, 1987

[51] Int. Cl.⁴ .............................................. H05K 9/00
[52] U.S. Cl. .................. 174/35 MS; 292/48; 292/196; 292/DIG. 65
[58] Field of Search .......... 174/35 MS, 35 GC, 35 R; 49/394, 395; 292/48, 196, 216, 223, DIG. 65, 26

[56] References Cited

U.S. PATENT DOCUMENTS

| | | | |
|---|---|---|---|
| 1,554,700 | 9/1925 | Anderson | 292/48 |
| 2,172,467 | 9/1939 | Geddes | 292/216 X |
| 2,745,132 | 5/1956 | Clark et al. | 292/48 X |
| 2,927,812 | 3/1960 | Smith et al. | 292/196 |
| 2,978,757 | 4/1961 | Ammerman | 292/196 X |
| 3,145,040 | 8/1964 | Phelps | 292/196 X |
| 3,413,025 | 11/1968 | Sperry | 292/26 X |
| 3,553,985 | 1/1971 | Pepp, Jr. et al. | 49/394 X |
| 4,089,435 | 5/1978 | Corompt | 49/395 X |
| 4,561,209 | 12/1985 | Sohlstrom | 49/395 X |
| 4,571,449 | 2/1986 | Lindenberger et al. | 174/35 GC X |

FOREIGN PATENT DOCUMENTS

| | | | |
|---|---|---|---|
| 622197 | 11/1935 | Fed. Rep. of Germany | 292/97 |
| 359039 | 1/1906 | France | 292/48 |
| 793975 | 4/1958 | United Kingdom | 292/196 |

Primary Examiner—Arthur T. Grimley
Assistant Examiner—David A. Tone
Attorney, Agent, or Firm—Berman, Aisenberg & Platt

[57] ABSTRACT

An electromagnetic shielding cabinet is provided with a unique latch which does not require shielding. The latch includes a rotatable handle connected to a rotatable cam by a link. The rotatable cam includes a slot which engages a roller stud on a door to open and close the door. Conductive gaskets are provided on the cabinet walls and are engaged by wedges on the door, the rotation of the cam assisting in urging the wedge into or out of the space between flexible finger stock pieces. Because the latch is provided in a small recess in the side wall of the cabinet, no significant interior space of the cabinet is utilized.

13 Claims, 2 Drawing Sheets

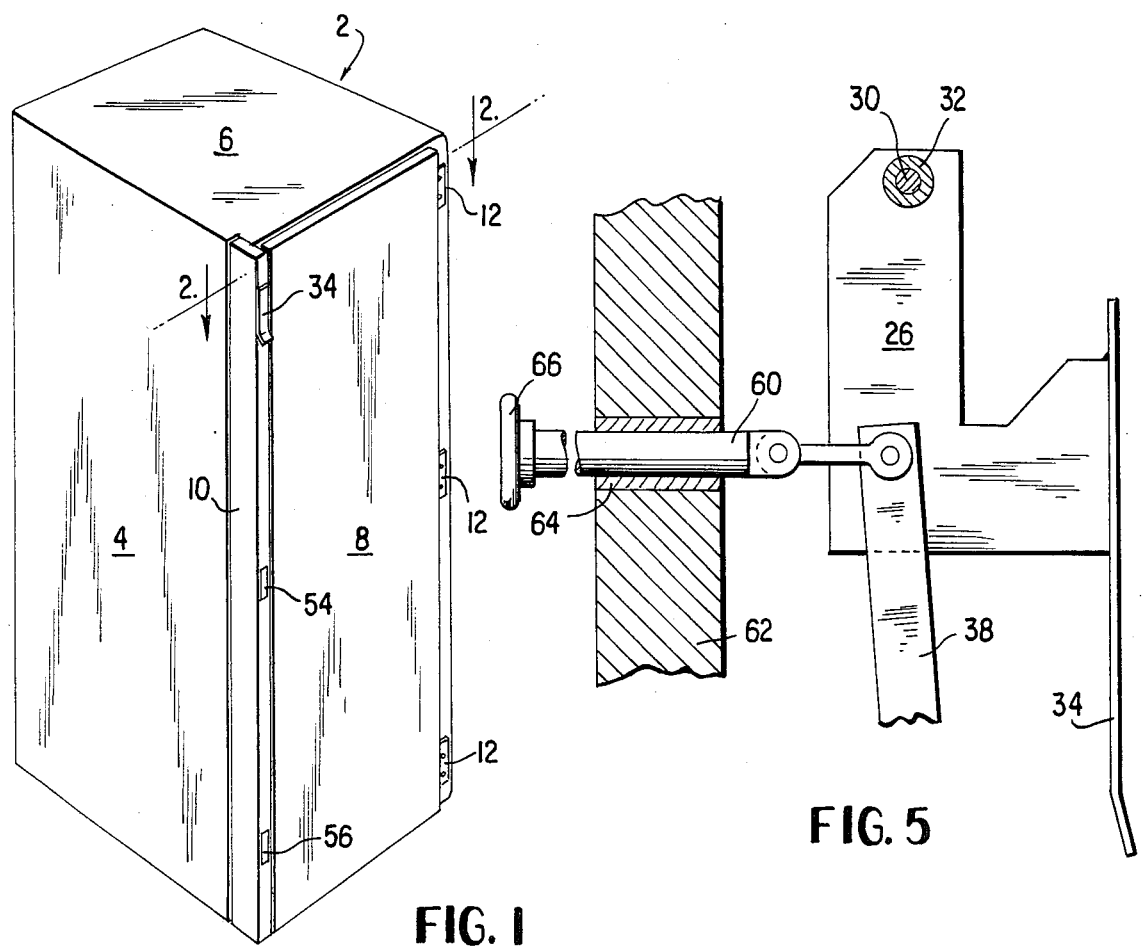
FIG. 1
FIG. 5
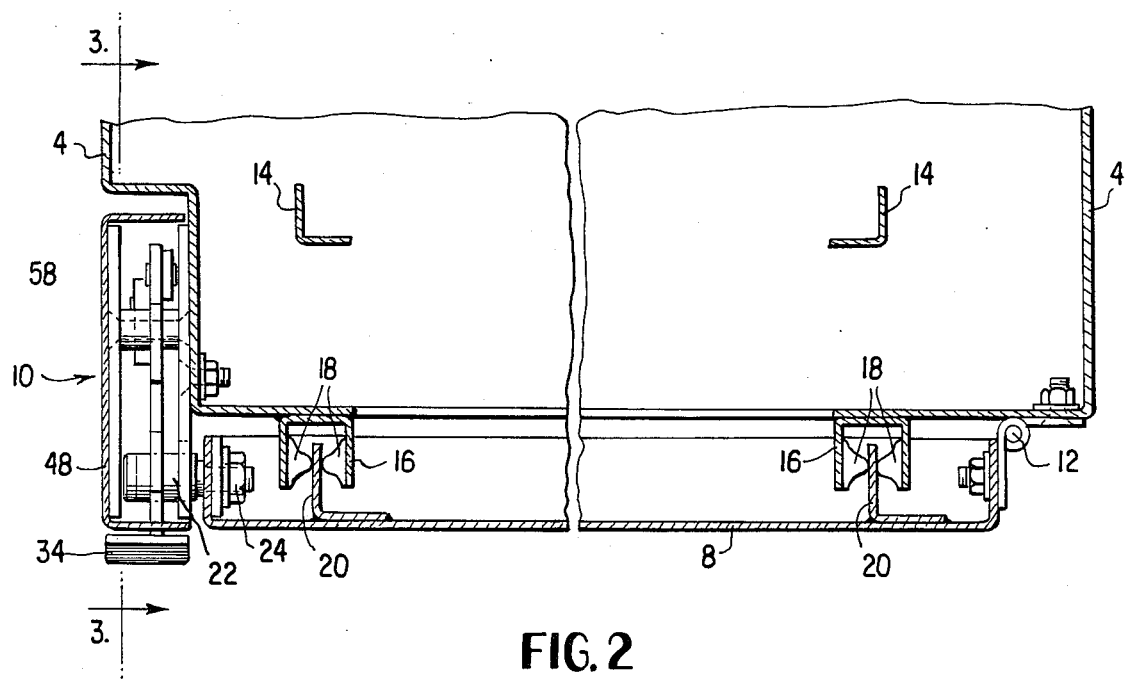
FIG. 2

CABINET LATCH & ELECTROMAGNETIC SHIELDING ENCLOSURE INCLUDING SAME

TECHNICAL FIELD

This invention relates to the art of enclosures, and in particular to the art of electromagnetic shielding enclosures and door latches therefor.

BACKGROUND ART

It is common in many applications of electronic equipment to provide for electronic shielding. This shielding prevents or drastically reduces the transmission of electromagnetic signals to accomplish various purposes. For example, it may be desired to prevent the surreptitious detection of electromagnetic signals emitted by an electronic device. In this case, the electronic device is placed in a shielding cabinet. In other instances it is desirable to prevent the imposition of unknown electromagnetic radiation onto an electronic device. In this instance, the device is also placed in a shielding room or cabinet.

An electronically shielding cabinet is typically made of metal and includes metal components. If a room is employed, a metal screen is typically provided, and the door or windows are provided with gaskets to ensure electrical contact.

Typical gaskets include finger stock, made of a flexible metal, to provide spring-like fingers which are secured to one part of a cabinet or door jam of a room, while another part is engaged by the closed door. In another known gasket, the door jam or cabinet is provided with a double row of finger stock gasket material, and the door is provided with a wedge which is inserted between the rows of finger stock when the door is closed.

The double row of finger stock gasket is more reliable and has uniform attenuation because the spring pressures are equalized. This type of arrangement, however, requires a mechanism to assist in opening and closing a door of any substantial size because of the force required to urge the wedge between the gaskets. In one known mechanism, a door has a vertically movable cam follower which engages a sloped cam on an edge of the cabinet. As the cam follower is urged upwardly, it rides along the cam to pull the door closed. The cam follower is operated by a push rod which is connected to a disk rotated by a handle. This design is popular because a rotating handle shaft is easily electrically sealed by the use of round bushings with controlled tolerances. The disadvantage, however, is that the handle must be large to obtain an adequate mechanical advantage. Moreover, the mechanism has a large requirement for operational space, and often interferes with the placement of windows to allow viewing of the interior of the room or cabinet.

Other arrangements for rooms or cabinets not provided with electromagnetic shielding are known. U.S. Pat. No. 2,745,132 (Clark et al.) shows a refrigerator wherein a door carries a latch mechanism which comprises a pivotable latch bolt operated by a linearly-movable actuating link. The latch bolt engages a stud attached to a swinging leaf of a hinge. The linearly moving actuating link is operated by a crank operated from a central, rotational handle located in the middle of the door.

Other door latches are shown in U.S. Pat. Nos. 1,554,700 (Anderson), 1,529,085 (Preble), 1,923,903 (Albach et al.), 2,130,302 (Henderson), 3,413,025 (Sperry), and 3,882,291 (Chiboroski).

SUMMARY OF THE INVENTION

In accordance with the invention, a unique latch is used with an electromagnetically shielding enclosure, such as a cabinet or a room. The latch includes a handle which is pivotally mounted to a cabinet or a door jam, and a cam. The cam is pivotally mounted for rotation about an axis parallel to the axis or rotation of the handle and is connected to the handle by a link. The link causes the cam to rotate with the handle and provides a mechanical advantage.

A door includes an outwardly extending stud received by a slot in the cam. As the cam is rotated into a closed position, the door is pulled inwardly also to a closed position.

When the latch in accordance with the invention is utilized with an electromagnetic shielding cabinet, the latch is secured to a side wall of the cabinet, preferably in a recess thereof, and the door is provided with wedges which engage finger stock to provide an electromagnetic connection between the cabinet and the door. Because the latch is placed entirely outside of the electromagnetically shielding area, no special provision need be made for shielding the latch, and this is highly advantageous.

To ensure that the entire door is held in contact with the gasket material, additional cams may be located along the edge of the cabinet to engage respective studs along the edge of the door. The additional cams are connected to an initial cam by pivotally attached links.

Another function of the cam is to assist in opening the door, and the placement of cams along the door prevents twisting of the door and ensures even opening.

An object of this invention to provide a unique latch which is highly useful with electromagnetically shielding enclosures.

Another object of this invention is to provide an electromagnetically shielding cabinet having a latch which does not require individual shielding.

Yet another object of this invention is to provide a cabinet having a door latch which is easily used and attractive.

BRIEF DESCRIPTION OF THE DRAWINGS

FIG. 1 is a perspective view of an electromagnetic shielding cabinet in accordance with the invention.

FIG. 2 is a cross-section taken along line 2—2 of FIG. 1.

FIG. 5 is a side view of an embodiment of the invention having a means for opening an enclosure from the interior thereof.

DETAILED DESCRIPTION OF THE DRAWINGS

Figure 4:
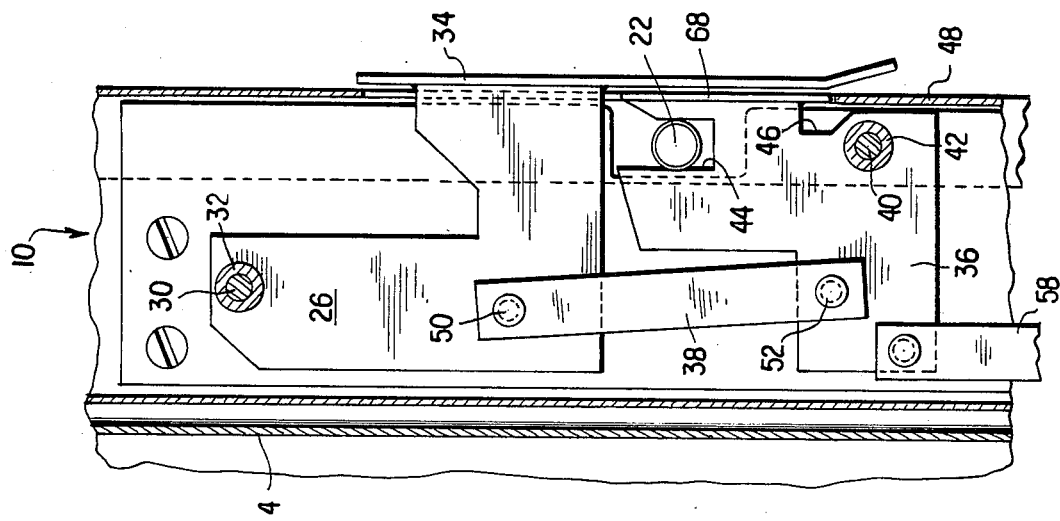
FIG. 4 is a cross-section taken along line 3—3 of FIG. 2 when the latch is in a closed position.

FIG. 1 is a perspective view of an electromagnetic shielding cabinet 2. The cabinet includes side walls 4, a top 6, a door 8, and a latching mechanism 10. Door 8 is shown secured to a side wall of cabinet 2 by a plurality of hinges 12.

FIG. 2 is a cross-section taken along line 2—2 of FIG. 1. The interior of the cabinet includes rails 14 for supporting electronic equipment, or the like. In a typical cabinet, rails 14 are spaced at 19 inches, and cabinet 2 has a width of 24 inches. In accordance with the invention, one of the side walls is provided with a recess for receiving latching mechanism 10, and it will be appreciated from FIG. 2 that no useful space is sacrificed by providing this recess. Cabinet 2 is preferably constructed of electromagnetic shielding material, such as metal or another material having a metal shield, to provide a shielding enclosure. To provide electromagnetic shielding at the connection between the door and the remainder of the cabinet, a conductive seal is provided. Each conductive seal includes a U-shaped bracket 16 and a pair of flexible finger stock conductors 18. Door 8 includes wedges 20 which are electrically conductive and are in electrical communication with door 8. Wedges 20 are forced between finger stock pieces 18 when the door is closed to provide electrical contact between side walls 4 and door 8 to provide a complete electromagnetic shielding enclosure.

Door 8 includes an outwardly extending roller stud 22 which may be secured to door 8 in any of several known manners, but is shown attached to door 8 by nut 24.

Figure 3:
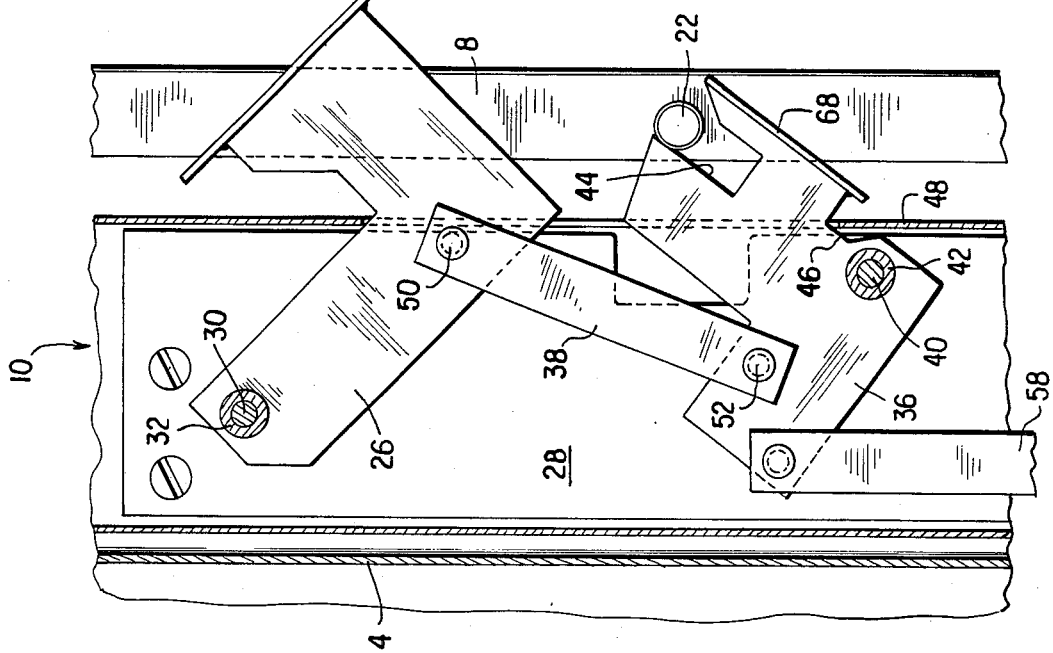
FIG. 3 is a cross-section taken along line 3—3 of FIG. 2 when the latch is in an open condition.

With reference to FIGS. 3 and 4, the operation of latch 10 will be described. Latch 10 includes a handle 26 which is pivotally attached to plate 28 which is in turn secured to the recessed portion of a sidewall 4 as shown in FIG. 2. Handle 26 is pivotally mounted to plate 28 at a pin 30 and includes a bushing 32. Handle 26 includes a lever 34 for permitting an operator to easily manipulate handle 26 in a rotational operation and to provide a mechanical advantage.

Handle 26 is connected to a cam 36 by a link 38. Link 38 preferably comprises two straps extending on both sides of handle 26 and cam 36 for strength. Link 38 is pivotally attached to both handle 26 and cam 36. Cam 36 is mounted to plate 28 for rotation about pin 40 and also includes a bushing 42. It will appreciated that when handle 26 is rotated in one direction, cam 36 is caused to rotate in an opposite direction by link 38.

Cam 36 includes a slot 44 for engaging roller stud 22. FIG. 3 shows latching mechanism 10 when door 8 is in a partially closed position, roller stud 22 being engaged at the outer end of slot 44. When handle 26 is rotated to its uppermost position, cam 36 is rotated to its lowermost position, notch 46 receiving an edge of decorative covering 48.

FIG. 4 shows latch 10 in a closed position, cam 36 having pulled roller stud 22 inwardly to hold door 8 closed. In this position, link 38 has been pivoted to lie in an orientation approximately 5° beyond the closest distance between connections 50 and 52. This holds handle 26 in the closed orientation shown in FIG. 4.

It will be appreciated that operation of handle 26 by lever 34 in a counter-clockwise direction assists in pulling wedges 20 from between finger stocks 18 and thus greatly assists in opening door 8. Generally, when closing door 8, rotation of handle 26 in a clockwise direction provides a mechanical advantage to urge wedges 20 into the opening between pieces of finger stock 18.

To secure door 8 at a plurality of locations, additional cams 54 and 56, (see FIG. 1) substantially identical to cam 36 are provided. These cams include slots, such as slot 44 of cam 36, for receiving roller bolts similarly spaced along the edge of door 8 and substantially identical to roller bolt 22. Connecting link 58 is pivotally attached to cam 36 and to cam 54. A similar link connects cam 54 to cam 56. As noted with respect to link 38, connecting link 58 preferably comprises two straps on opposite sides of the cams for added strength. When handle 26 is rotated, cams 36, 54, and 56 rotate in the same manner as shown in FIGS. 3 and 4 with respect to cam 36.

FIG. 5 is an alternative arrangement illustrating a mechanism for operation of the latch from within an enclosure. A push rod 60 extends through wall 62, such as an inwardly directed portion of the recess in wall 4. A bushing 64 provides a close tolerance between the hole receiving push rod 60 and the outer surface of push rod 60. A plate 66 provides a convenient means for receiving the palm of an operator. To cause the cabinet to open from the interior, it is merely necessary for one to push on plate 66 to cause handle 26 to rotate in a counter-clockwise direction to open door 8.

It will be appreciated that the arrangement described above is quite advantageous when used with an electromagnetic shielding cabinet because the rotating handle and cam are connected to the exterior of the cabinet and do not require shielding. With reference to FIG. 2, it is easily seen that finger stock pieces 18 and wedges 20 provide the required seal between the cabinet and the door and that the cabinet requires no additional shielding. Furthermore, cam 36 rotates to a position to receive roller stud 22 shown in FIG. 3 as lever 34 is pivoted to a position which allows passage of roller stud 22 to engage slot 44. When handle 26 is rotated to a closed position as shown in FIG. 4, decorative lever 34 covers cam 36 to provide a pleasing appearance. Cam 36 provides an outer wall 68 which lies flush with decorative covering 48 when in the closed position. Accordingly, openings are provided in decorative covering 48 for cams 54 and 56 which are relatively small and are filled by respective outer walls of cams 54 and 56 when in a closed position to provide a pleasing appearance.

While opposed finger stock pieces 18 and wedge 20 have been illustrated, it will be appreciated other conductive gaskets such as a face-type metal gasket may be used. When such a face-type gasket is used, the over-the-center arrangement for link 38 provides a constant, inwardly directed force to maintain contact between the door and the face-type gasket.

What is claimed is:

1. A latch comprising handle means mounted for rotation about a first axis, cam means mounted for rotation about a second axis parallel to said first axis, link means pivotally attached to said handle means and pivotally attached to said cam means for causing rotation of said entire cam means about said second axis upon rotation of said handle means in either direction about said first axis, wherein said cam means includes a slot having a first wall for engaging a stud on a door in a partially open condition when said handle means and said cam means are in respective first rotational positions for moving said door to a closed condition when said handle means and said cam means are moved from said first rotational positions to second rotational positions, and a second wall for engaging said stud and forcing said door to an open position when said handle means and cam means are moved from said second positions to said first positions.

2. A latch according to claim 1 wherein said handle comprises actuating lever means for being grasped by an operator, said actuating lever means overlying said projection when said handle means and cam means are in said second respective rotational positions.

3. A latch according to claim 1 wherein said link means is mounted to said handle means for rotation about a third axis and mounted to said cam means for rotation about a fourth axis, wherein said third and fourth axes are parallel to and between said first and second axes.

4. An electromagnetic shielding enclosure comprising two spaced side walls, a door, an electromagnetic shielding gasket attached to said side walls to cooperate with said side walls and said door to form an electromagnetic shielding volume, and a latch for forcing said door open and forcing said door closed, wherein said latch comprises handle means mounted for rotation about a first axis, cam means mounted for rotation about a second axis parallel to said first axis, and link means connecting said handle means and said cam means, said cam means comprising a projection having a slot therein for receiving a stud extending outwardly from said door, said latch being located outside of said volume.

5. An enclosure according to claim 4 further comprising second cam means mounted for rotation about an axis parallel to said second axis and connected to said cam means by second link means for causing co-rotation of said cam means and said second cam means, said second cam means having a projection with a slot therein for receiving a second stud attached to said door.

6. An enclosure according to claim 4 wherein one of said walls has a recess therein and said latch is located in said recess.

7. An enclosure according to claim 6 wherein said gasket comprises flexible conductor means attached to said side walls.

8. An enclosure according to claim 7 further comprising wedge means attached to said door for engaging said conductor means when said door is closed.

9. An enclosure according to claim 6 further comprising lever means attached to said handle means for being grasped by an operator, said lever means being elongate and overlying a front wall of said cam means when said latch is in a closed position.

10. An enclosure according to claim 9 further comprising second cam means mounted for rotation about an axis parallel to said second axis and having a projection for receiving a second stud attached to said door.

11. An enclosure according to claim 10 further comprising cover means for at least partially covering said latch, said cover means having a front wall with an opening therein for receiving said second cam means, said second cam means having a front wall flush with said front wall of said cover when said second cam means is in a closed position.

12. An enclosure according to claim 11 wherein said second cam means includes a notch for receiving an edge of said cover.

13. An electromagnetic shielding cabinet comprising a side wall, a door, electromagnetic shielding means attached to said side wall and said door for providing an electromagnetic shielding enclosure when said door is in a closed position, and latch means outside of said electromagnetic shielding enclosure for opening and closing said door, said latch means comprising means for forcing said door open and for forcing said door closed, wherein a first part of said latch means is attached to a side of said door and a second part of said latch means is attached to said side wall, and wherein said latch means comprises operating means operable from the front of said door.

* * * * *